US010825989B2

(12) United States Patent
Takeda et al.

(10) Patent No.: US 10,825,989 B2
(45) Date of Patent: Nov. 3, 2020

(54) VAPOR DEPOSITION MASK, FRAME-EQUIPPED VAPOR DEPOSITION MASK, AND METHOD FOR PRODUCING ORGANIC SEMICONDUCTOR ELEMENT

(71) Applicant: Dai Nippon Printing Co., Ltd., Tokyo (JP)

(72) Inventors: Toshihiko Takeda, Tokyo (JP); Katsunari Obata, Tokyo (JP); Hiroshi Kawasaki, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/430,505

(22) Filed: Jun. 4, 2019

(65) Prior Publication Data

US 2019/0305223 A1 Oct. 3, 2019

Related U.S. Application Data

(63) Continuation of application No. 15/719,683, filed on Sep. 29, 2017, now Pat. No. 10,355,209, which is a (Continued)

(30) Foreign Application Priority Data

Nov. 14, 2013 (JP) ................................ 2013-235711
Oct. 8, 2014 (JP) ................................ 2014-207030

(51) Int. Cl.
*H01L 51/00* (2006.01)
*H01L 51/56* (2006.01)

(Continued)

(52) U.S. Cl.
CPC ........ *H01L 51/0011* (2013.01); *C23C 14/042* (2013.01); *C23C 14/24* (2013.01);

(Continued)

(58) Field of Classification Search
CPC ..... H01L 51/0011; H01L 51/56; H01L 51/001
See application file for complete search history.

(56) References Cited

U.S. PATENT DOCUMENTS 4,935,334 A * 6/1990 Boettiger ............... G03F 7/201 430/322
2004/0003775 A1 1/2004 Kim (Continued)

FOREIGN PATENT DOCUMENTS

CN 1476041 A 2/2004
JP 11-222664 A1 8/1999

(Continued)

OTHER PUBLICATIONS

International Search Report and Written Opinion (Application No. PCT/JP2014/077049) dated Dec. 16, 2014.

(Continued)

*Primary Examiner* — Kyoung Lee
*Assistant Examiner* — Christina A Sylvia
(74) *Attorney, Agent, or Firm* — Burr & Brown, PLLC

(57) ABSTRACT

A vapor deposition mask includes a metal mask and a resin mask having an opening. An inner wall surface for composing the opening has an inflection point in a thicknesswise cross section of the resin mask. When an intersection of a first surface, not facing the metal mask, of the resin mask and the inner wall surface is set to be a first intersection, an intersection of a second surface, facing the metal mask, of the resin mask and the inner wall surface is set to be a second intersection, and there is set a first inflection point first positioned from the first intersection toward the second intersection, an angle formed by a line connecting the first intersection and the first inflection point and the first surface (Continued)

is larger than an angle formed by a line connecting the first inflection point and the second intersection and the second surface.

10 Claims, 9 Drawing Sheets

Related U.S. Application Data continuation of application No. 15/150,678, filed on May 10, 2016, now Pat. No. 9,806,257, which is a continuation of application No. PCT/JP2014/077049, filed on Oct. 9, 2014.

(51) Int. Cl.
*C23C 14/24* (2006.01)
*C23C 14/04* (2006.01)
*C23C 16/04* (2006.01)

(52) U.S. Cl.
CPC ............ *C23C 16/042* (2013.01); *H01L 51/56* (2013.01); *H01L 51/001* (2013.01)

(56) References Cited

U.S. PATENT DOCUMENTS

| | | | |
|---|---|---|---|
| 2005/0166842 | A1 | 8/2005 | Sakamoto |
| 2007/0126030 | A1 | 6/2007 | Ito |
| 2012/0060756 | A1 | 3/2012 | Ookawara et al. |
| 2015/0017759 | A1 | 1/2015 | Hirobe et al. |
| 2015/0037928 | A1 | 2/2015 | Hirobe et al. |
| 2015/0251205 | A1 | 9/2015 | Hirobe et al. |
| 2016/0047030 | A1 | 2/2016 | Obata et al. |
| 2016/0168691 | A1 | 6/2016 | Takeda et al. |
| 2016/0281209 | A1 | 9/2016 | Mizumura |

FOREIGN PATENT DOCUMENTS

| | | | | |
|---|---|---|---|---|
| JP | 2003-045657 | A1 | 2/2003 | |
| JP | 2006-059599 | A1 | 3/2006 | |
| JP | 2009-041054 | A1 | 2/2009 | |
| JP | 2009-068082 | A1 | 4/2009 | |
| JP | 2009-074160 | A1 | 4/2009 | |
| JP | 2010-216000 | A1 | 9/2010 | |
| JP | 3164800 | U | 12/2010 | |
| JP | 2012-004486 | A1 | 1/2012 | |
| JP | 2013-165060 | A1 | 8/2013 | |
| JP | 5288072 | B2 | 9/2013 | |
| WO | 2013/105642 | A1 | 7/2013 | |
| WO | WO-2013105645 | A1 * | 7/2013 | .......... H01L 51/0011 |
| WO | 2015/093304 | A1 | 6/2015 | |

OTHER PUBLICATIONS

Chinese Office Action (Application No. 201480056597.X) dated Jun. 13, 2017.

International Application No. PCT/JP2013/050423 filed Jan. 11, 2013.

* cited by examiner

VAPOR DEPOSITION MASK, FRAME-EQUIPPED VAPOR DEPOSITION MASK, AND METHOD FOR PRODUCING ORGANIC SEMICONDUCTOR ELEMENT

CROSS REFERENCE TO RELATED APPLICATIONS

This application is a continuation of U.S. application Ser. No. 15/719,683, filed Sep. 29, 2017, which is a continuation of U.S. application Ser. No. 15/150,678, filed May 10, 2016, now U.S. Pat. No. 9,806,257, issued Oct. 31, 2017, which in turn is a continuation of International Application No. PCT/JP2014/077049, filed Oct. 9, 2014, which designated the United States, the entireties of which are incorporated herein by reference.

FIELD OF THE INVENTION

The present disclosure relates to a vapor deposition mask, a frame-equipped vapor deposition mask, and a method for producing an organic semiconductor element.

BACKGROUND OF THE INVENTION

With upsizing of the products using organic EL elements or increase in substrate sizes, a demand for upsizing is also growing with respect to vapor deposition masks. Further, the metal plates for use in production of the vapor deposition masks composed of metals are also upsized. However, with the present metal processing technique, it is difficult to form slits in a large metal plate with high precision and these cannot respond to enhancement in definition of the slits. Further, in the case of use of a vapor deposition mask composed of only a metal, the weight thereof also increases with upsizing, and the total mass including a frame also increases, which becomes a hindrance to handling.

Under such circumstances, in Patent Literature 1, there is proposed a vapor deposition mask including a metal mask in which slits are provided and a resin mask which is positioned on the surface of the metal mask and in which openings corresponding to a pattern to be produced by vapor deposition are arranged for a plurality of rows in the lengthwise direction and the widthwise direction, the metal mask and the resin mask being stacked. The vapor deposition mask proposed in Patent Literature 1 is regarded as being capable of satisfying both high definition and lightweight in upsizing and forming a vapor deposition pattern with high definition.

Moreover, Patent Document 1 above discloses that a cross-sectional shape of the opening or a cross-sectional shape of the slit is preferably a shape having broadening toward a vapor deposition source side in order to prevent generation of a shadow in production by vapor deposition with use of the vapor deposition mask. Notably, the shadow is a phenomenon that a part of a vapor deposition material released from the vapor deposition source collides with inner wall surfaces of the slit of the metal mask and/or the opening of the resin mask and does not reach the vapor deposition target, and thereby, a portion without vapor deposition that has a film thickness smaller than the intended vapor deposition film thickness arises. Furthermore, Patent Literature 1 above discloses that an angle formed by a straight line connecting a lower bottom distal end in the opening of the resin mask and an upper bottom distal end in the opening of the resin mask and the surface of the resin mask is preferably within a range of 5° to 85°, still preferably within a range of 15° to 80°, further preferably within a range of 25° to 65°. Studying the contents of Patent Document 1 above, it can be considered that the cross-sectional shape of the opening is preferably set to be a shape having larger broadening toward the vapor deposition source side in order to effectively prevent generation of a shadow. In other words, it can be considered that an angle formed by the straight line connecting the lower bottom distal end in the opening of the resin mask and the upper bottom distal end in the opening of the resin mask and a surface of the resin mask on a side of not being in contact with the metal mask is preferably set to be as small an angle as possible.

Now, even in the case where the cross-sectional shape of the opening is set to be a shape having broadening toward the vapor deposition source side, when the resin mask has a large thickness, there can be a case where generation of a shadow cannot be sufficiently prevented. Accordingly, it can be considered that in order to sufficiently suppress generation of a shadow, a measure to make the thickness of the resin mask small is needed to be taken while the cross-sectional shape of the opening is set to be a shape having larger broadening toward the vapor deposition source side. However, in the case of taking this measure, the strength of the openings of the resin mask deteriorate, and moreover, the dimensional precision of the openings on the surface of the resin mask not in contact with the metal mask deteriorates. Moreover, as the aforementioned angle formed by the straight line connecting the lower bottom distal end in the opening of the resin mask and the upper bottom distal end in the opening of the resin mask and the surface of the resin mask is made smaller, the opening dimension of the opening on the surface on the side of being in contact with the metal mask becomes larger. In the case where the opening dimension of the opening on the surface of the resin mask on the side of being in contact with the metal mask becomes large, the pitch between the neighboring openings becomes narrow, which can sometimes causes a hindrance in arranging a metal portion for composing a slit of the metal mask between the neighboring openings in the lengthwise direction or the crosswise direction.

Related Art Document

Patent Document

[Patent Document 1]
Japanese Patent No. 5288072

SUMMARY OF THE INVENTION

Some embodiments of the present invention are devised in view of such circumstances, and some objects thereof are to provide a vapor deposition mask and a frame-equipped vapor deposition mask capable of satisfying both high definition and light weight in upsizing and suppressing generation of a shadow while securing the strength of openings, and to provide a method for producing an organic semiconductor element capable of producing an organic semiconductor element excellent in precision.

According to an embodiment of the present invention, there is provided a vapor deposition mask including: a metal mask in which a slit is provided; and a resin mask having a first surface, an opposed second surface, and an opening extending in a thickness direction of the resin mask from the first surface to the second surface and corresponding to a pattern to be produced by vapor deposition. The metal mask is stacked on the second surface of the resin mask. An inner wall surface for composing the opening of the resin mask has at least one inflection point along the thickness direction. In the thickness direction, an intersection of the first surface and the inner wall surface is a first intersection, an intersection of the second surface and the inner wall surface is a second intersection, and the inflection point is positioned between the first intersection and the second intersection. An angle (θ1), formed between a straight line connecting the first intersection and the inflection point and the first surface, is larger than an angle (θ2), formed between an imaginary extension of a straight line connecting the inflection point and the second intersection and the second surface. At least a portion of the inner wall surface extends outwardly from the first surface toward the second surface in the thickness direction.

Moreover, according to an embodiment of the present invention, there is provided a method for producing an organic semiconductor element including a step of forming a vapor deposition pattern on a vapor deposition target with use of a frame-equipped vapor deposition mask including a vapor deposition mask which is fixed to a frame, wherein in the step of forming the vapor deposition pattern, the vapor deposition mask fixed to the frame includes: a metal mask in which a slit is provided; and a resin mask having a first surface, an opposed second surface, and an opening extending in a thickness direction of the resin mask from the first surface to the second surface and corresponding to a pattern to be produced by vapor deposition is provided, the metal mask being stacked on the second surface of the resin mask. An inner wall surface for composing the opening of the resin mask has at least one inflection point along the thickness direction. In the thickness direction, an intersection of the first surface and the inner wall surface is a first intersection, an intersection of the second surface and the inner wall surface is a second intersection, and the inflection point is positioned between the first intersection and the second intersection. An angle (θ1), formed between a straight line connecting the first intersection and the inflection point and the first surface, is larger than an angle (θ2), formed between an imaginary extension of a straight line connecting the inflection point and the second intersection and the second surface. At least a portion of the inner wall surface extends outwardly from the first surface toward the second surface in the thickness direction.

Moreover, according to an embodiment of the present invention, there is provided a frame-equipped vapor deposition mask including a vapor deposition mask which is fixed to a frame, wherein the vapor deposition mask includes: a metal mask in which a slit is provided; and a resin mask having a first surface, an opposed second surface, and an opening extending in a thickness direction of the resin mask from the first surface to the second surface and corresponding to a pattern to be produced by vapor deposition. The metal mask is stacked on the second surface of the resin mask. An inner wall surface for composing the opening of the resin mask has at least one inflection point along the thickness direction. In the thickness direction, an intersection of the first surface and the inner wall surface is a first intersection, an intersection of the second surface and the inner wall surface is a second intersection, and the inflection point is positioned between the first intersection and the second intersection. An angle (θ1), formed between a straight line connecting the first intersection and the inflection point and the first surface, is larger than an angle (θ2), formed between an imaginary extension of a straight line connecting the inflection point and the second intersection and the second surface. At least a portion of the inner wall surface extends outwardly from the first surface toward the second surface in the thickness direction.

DETAILED DESCRIPTION OF THE INVENTION

Vapor Deposition Mask

Hereafter, a vapor deposition mask 100 of an embodiment of the present invention is specifically described.

Figure 1:
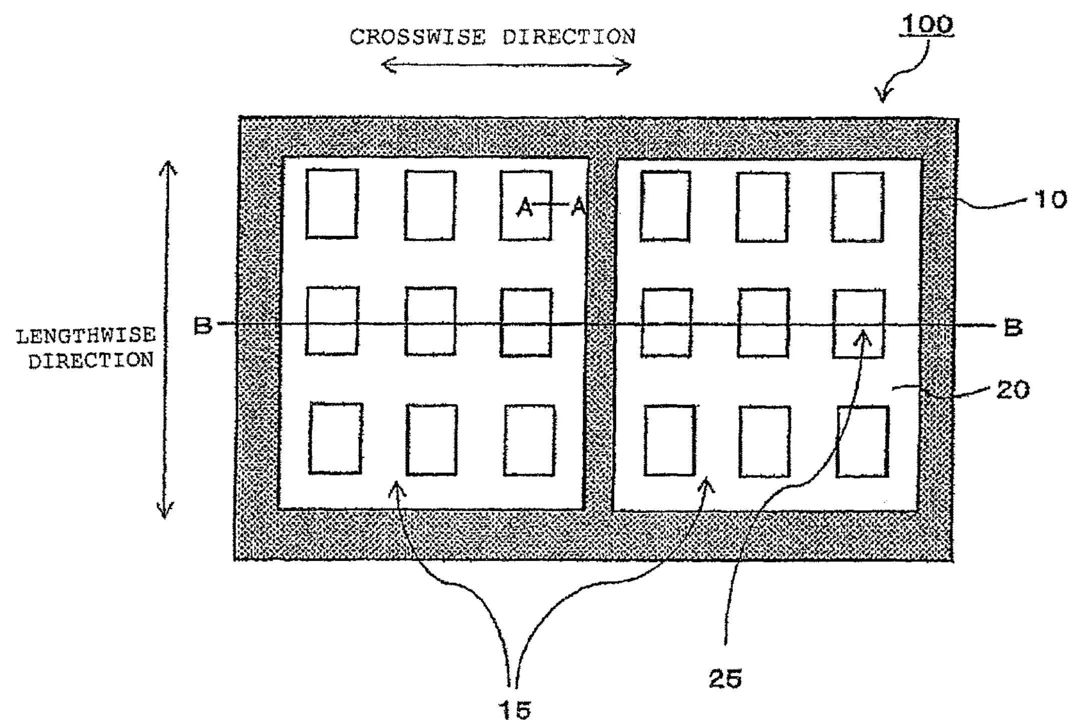
FIG. 1 is an elevation view of a vapor deposition mask of an embodiment as seen from a metal mask side.

As shown in FIG. 1, the vapor deposition mask 100 of an embodiment of the present invention has a configuration in which a metal mask 10 in which slits 15 are provided is stacked on one surface of a resin mask 20 in which openings 25 corresponding to a pattern to be produced by vapor deposition are provided. The resin mask has a first surface and an opposed second surface. Hereafter, configurations in the vapor deposition mask of an embodiment are described.

Resin Mask

As shown in FIG. 1, in the resin mask 20, a plurality of openings 25 are provided. FIG. 1 is an elevation view of the vapor deposition mask of an embodiment as seen from the metal mask side. Furthermore, as shown in FIGS. 2 to 5, the resin mask 20 has an inner wall surface for composing the opening 25 of the resin mask 20 that extends in the thickness direction of the resin mask 20 from the first surface to the second surface. The inner wall surface has at least one inflection point (S1) in the thickness direction of the resin mask. An intersection of the first surface and the inner wall surface is a first intersection (Q1), an intersection of the second surface and the inner wall surface is a second intersection (Q2), and the inflection point (S1) is positioned between the first intersection (Q1) and the second intersection (Q2). An angle (θ1), formed between a straight line (T1) connecting the first intersection (Q1) and the inflection point (S1) and the first surface, is larger than an angle (θ2), formed between an imaginary extension of a straight line (T2) connecting the inflection point (S1) and the second intersection (Q2) and the second surface. At least a portion of the inner wall surface extends outwardly from the first surface toward the second surface in the thickness direction. Notably, FIGS. 2 to 5 are schematic cross-sectional views of A-A portion in FIG. 1 and diagrams for explaining cross-sectional shapes of the inner wall surface of the opening 25. "Inner wall surface for composing an opening" stated in the present specification means a surface, of the resin mask, that forms the opening itself, in other words, a surface that faces the space in the opening, in the opening penetrating the resin mask 20 in the thickness direction.

According to the vapor deposition mask of an embodiment that has the aforementioned feature, generation of a shadow can be sufficiently suppressed while securing the strength of openings. Hereafter, an advantage of an embodiment of the present invention is described, exemplified by a case (hereinafter referred to as comparative example) where the inner wall surface for composing the opening does not have an inflection point in the thickness direction.

In the comparative example, in order to suppress generation of a shadow, an opening dimension of the opening on the surface of the resin mask on the side in contact with the metal mask is determined by an angle formed by a straight line connecting the first intersection (Q1) and the second intersection (Q2) shown in each figure and the first surface. In order to suppress generation of a shadow, the angle formed by the straight line connecting the first intersection (Q1) and the second intersection (Q2) and the first surface needs to be small. Nevertheless, in the case of making the angle small, for example, in the case of making the angle small to approximate (θ2) shown in each figure, the strength of the openings deteriorates, which causes defects such as vapor deposition pattern failure to arise in production by vapor deposition using the vapor deposition mask. Moreover, this causes deterioration in opening dimension precision of the opening in the resin mask on the side that is not in contact with the metal mask. Notably, the opening dimension of the opening in the resin mask on the side that is not in contact with the metal mask corresponds to a pattern shape to be produced by vapor deposition using the vapor deposition mask.

Moreover, in the comparative example, in the case where the angle formed by the straight line connecting the first intersection and the second intersection and the first surface shown in each figure is made small down to an angle approximating (θ2) shown in each figure, the opening dimension of the opening on the surface on the side in contact with the metal mask becomes a larger dimension than the opening dimension of the opening in an embodiment of the present invention. In the case where the openings are regularly arranged in the crosswise direction or the lengthwise direction, when the opening dimension of the opening on the surface on the side in contact with the metal mask becomes large, the distance between the neighboring openings becomes narrow. This can sometimes cause a hindrance in arranging a metal portion for composing a slit of the metal mask between the neighboring openings.

Notably, "lengthwise direction" and "crosswise direction" stated in the present specification mean the vertical direction and the horizontal direction in the drawings, respectively, and may be any directions of the longitudinal direction and the width direction of the vapor deposition mask, the resin mask and the metal mask. For example, the longitudinal direction of the vapor deposition mask, the resin mask and the metal mask may be set to be the "lengthwise direction", or the width direction may be set to be the "lengthwise direction". Moreover, while in the present specification, the case where the shape of the vapor deposition mask in plan view is a rectangular shape is exemplarily described, it may be another shape such, for example, as a circular shape and a rhombic shape. In this case, the longitudinal direction of the diagonal line, the radial direction, or any direction only has to be set as the "longitudinal direction", the direction perpendicular to the "longitudinal direction" set as the "width direction (sometimes referred to as short-side direction)".

On the other hand, in an embodiment of the present invention, the inner wall surface has at least one inflection point in the thickness direction, and the relation is satisfied that the angle (θ1) formed by the straight line (T1) and the first surface>the angle (θ2) formed by an imaginary extension of the straight line (T2) and the second surface. Hence, the angle (θ1) can be made larger than the angle formed by the straight line connecting the first intersection (Q1) and the second intersection (Q2) and the first surface in the aforementioned comparative example. Therefore, even in the case where the thickness of the resin mask is made thin, the strength of the openings can be sufficiently satisfied. Moreover, according to an embodiment of the present invention, in the case where the angle formed by the straight line connecting the first intersection (Q1) and the second intersection (Q2) and the first surface in the comparative example is set to be the same angle as (θ2), the opening dimension of the opening 25 on the resin mask surface on the side in contact with the metal mask becomes smaller than the opening dimension of the opening in the comparative example. In this way, generation of a shadow can be sufficiently suppressed while securing the distance (pitch) between the openings, which does not cause a hindrance in arranging a metal portion for composing a slit of the metal mask between the neighboring openings.

The vapor deposition mask of an embodiment does not take it as an essential condition that all of the thickness direction cross sections of the inner wall surfaces for composing one opening have the aforementioned feature, but at least one inner wall surface of the inner wall surfaces for composing one opening is sufficient to have the aforementioned feature in the thickness direction. For example, out of the inner wall surfaces for composing the opening 25, the thickness direction cross sections of the inner wall surfaces opposing in the crosswise direction or the lengthwise direction may have the aforementioned feature, or all of the thickness direction cross sections of the inner wall surfaces for composing one opening 25 may have the aforementioned feature. For example, in the case where a linear source vapor deposition source is used in which the crosswise direction of the vapor deposition mask is the scanning direction in formation of the vapor deposition pattern using the vapor deposition mask of an embodiment of the present invention, the thickness direction cross sections of the inner wall surfaces opposing in the lengthwise direction out of the inner wall surfaces for composing the opening preferably have the aforementioned feature.

Moreover, while in a mode shown in each figure, the opening shape of the opening 25 exhibits a rectangular shape, the opening shape is not specially limited but the opening shape of the opening 25 may be rhombic or polygonal or may be a shape having a curvature such as a circle and an ellipsoid. Notably, it can be said that the rectangular or polygonal opening shape is a preferable opening shape of the opening 25 in view of capability of securing a larger area of light emission as compared with the opening shape having a curvature such as a circle and an ellipsoid.

Moreover, "thickness direction cross section" of the inner wall surface stated in the present specification means a cross section taken perpendicularly to the first and second surfaces of the resin mask 20, so as to intersect the inner wall surface of the opening.

As shown in FIGS. 2 to 5, the inner wall surface has at least one inflection point in the thickness direction cross section. Notably, in a mode shown in FIG. 2, the inner wall surface has one inflection point (S1) in the thickness direction. In the modes shown in FIGS. 3 to 5, the inner wall surface has two or more inflection points in the thickness direction cross section.

As long as the relation of θ1>θ2 is satisfied, specific angles of θ1 and θ2 are not specially limited and can be properly configured within a range where the relation is satisfied. Notably, in the case where the angle of θ1 is less than about 60°, the strength of the openings 25 tends to deteriorate depending on the thickness of the resin mask, and moreover, the dimensional precision of the openings on the surface on the side not in contact with the resin mask tends to deteriorate. Accordingly, with this point taken into consideration, the angle (θ1) formed by the straight line connecting the first inflection point (S1) and the first intersection (Q1) and the first surface is preferably not less than about 60°. The upper limit value is not specifically limited but is about 90°.

Moreover, even in the case where the aforementioned relation is satisfied, when the angle (θ2) formed between an imaginary extension of the straight line (T2) connecting the first inflection point (S1) and the second intersection (Q2) and the second surface exceeds about 70°, the effect of suppressing generation of a shadow tends to deteriorate. Accordingly, with this point taken into consideration, θ2 is preferably not more than about 70°. While the lower limit value is not specially limited, it is preferably not less than about 30° with the opening dimension of the opening on the surface on the side of being in contact with the metal mask and the broadening of the vapor deposition material radiated from the vapor deposition source taken into consideration.

Figure 3:
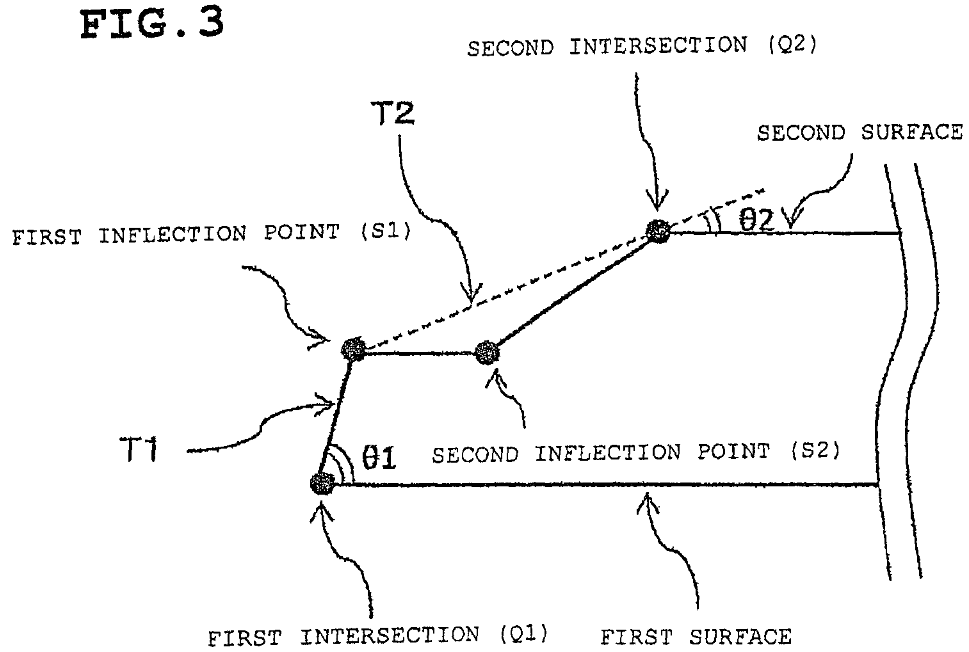
FIG. 3 is a variant of the view shown in FIG. 2.
Figure 4:
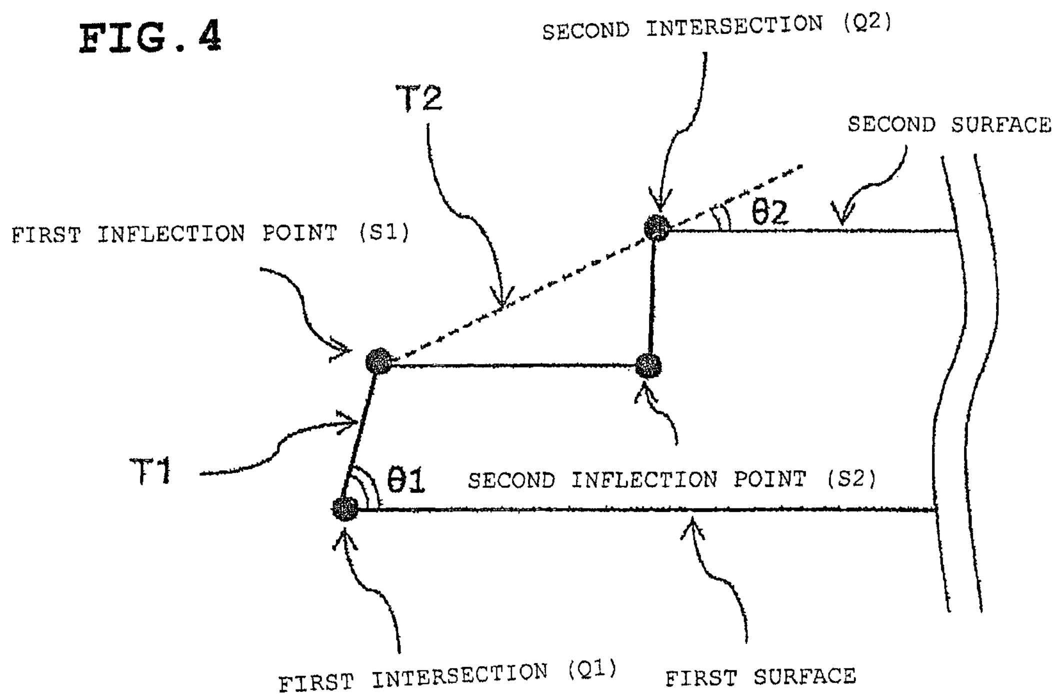
FIG. 4 is another variant of the view shown in FIG. 2.
Figure 5:
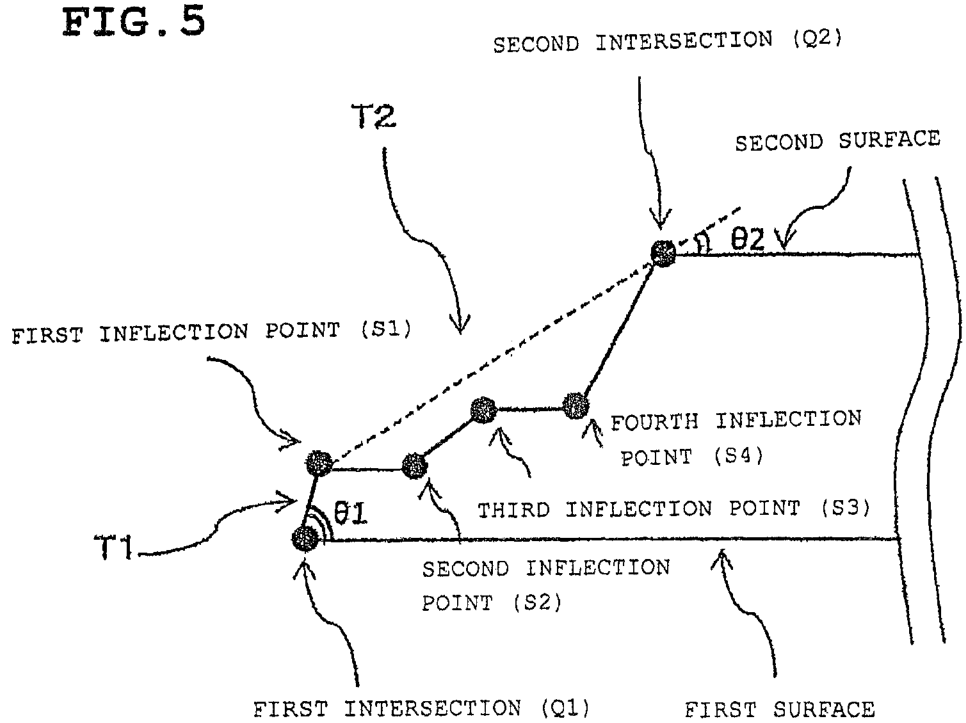
FIG. 5 is yet another variant of the view shown in FIG. 2.

Moreover, as shown in FIGS. 3 to 5, in the case where the thickness direction cross section of the inner wall surface has a plurality of inflection points, there is not any limitation to angles formed by straight lines connecting inflection points other than the first inflection point (S1) and the second intersection (Q2) and the second surface. For example, in the mode shown in FIG. 3, an angle formed between an imaginary extension of a straight line connecting a second inflection point (S2) and the second intersection (Q2) and the second surface is less than about 90°, and in the mode shown in FIG. 4, it is about 90°. Moreover, while in FIG. 5, an angle formed by a straight line connecting the second inflection point (S2) and a third inflection point (S3) and the first surface is smaller than θ1 and a smaller angle than an angle formed by a straight line connecting a fourth inflection point (S4) and the second intersection and the second surface, the angle formed by the straight line connecting the second inflection point (S2) and the third inflection point (S3) and the first surface may be a larger angle than θ1 and the angle formed by the straight line connecting the fourth inflection point (S4) and the second intersection and the second surface. In other words, there is not any limitation to the angles other than θ1 and θ2.

While the thickness of the resin mask 20 is not specially limited, in the case of further improving the effect of suppressing generation of a shadow, the thickness of the resin mask 20 is preferably about 25 μm or less, still preferably less than about 10 μm, particularly preferably about 8 μm or less. A preferable range of the lower limit value is not specially limited, but in the case where the thickness of the resin mask 20 is less than about 3 μm, defects such as a pinhole tend to arise and a risk of deformation or the like increases. In particular, by setting the thickness of the resin mask 20 to be about 3 μm or more and less than about 10 μm, still preferably about 4 μm or more and about 8 μm or less, synergetically with the aforementioned cross-sectional shape of the inner wall surface composing the opening 25 in the thickness direction, the influence of a shadow in formation of a high definition pattern exceeding about 400 ppi can be more effectively prevented. While the resin mask 20 may be directly bonded to the metal mask 10 mentioned later, or may be bonded via an adhesive layer, in the case where the resin mask 20 is bonded to the metal mask 10 via the adhesive layer, the total thickness of the resin mask 20 and the adhesive layer is preferably within the aforementioned preferable thickness range.

While the distance (D1 shown in FIG. 2) from the first surface to the first inflection point (S1) in the thickness direction (in the vertical direction) is not specially limited, it is preferably approximately about 20 to 80 where the thickness of the entirety of the resin mask is set to be 100. By setting the distance (D1) to be within this range, generation of a shadow can be more effectively suppressed while the strength of the openings 25 is sufficiently satisfied. The distance from the first inflection point (S1) to the second surface in the thickness direction can be properly configured in accordance with the aforementioned distance (D1).

For the resin mask 20, a conventionally known resin material can be properly selected and used, and while the material is not specially limited, a material that enable formation of the opening 25 with high definition by laser processing or the like, has a low rate of dimensional change and a low rate of humidity absorption under heat and with passage of time, and is light weight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinylalcohol copolymer resin, an ethylene-methacrylic acid copolymer resin, a polyvinyl chloride resin, a polyvinylidene chloride resin, cellophane, an ionomer resin and the like can be cited. Among the materials listed above, the resin materials with the thermal expansion coefficients of about 16 ppm/° C. or less are preferable, the resin materials with the rates of humidity absorption of about 1.0% or less are preferable, and the resin materials including both conditions are particularly preferable.

Moreover, a barrier layer can also be provided on the inner wall surface composing the opening 25 of the resin mask 20. As the barrier layer, a thin film layer or a vapor deposition layer of an inorganic oxide, an inorganic nitride or metal can be used. As the organic oxide, an oxide of aluminum, silicon, indium, tin or magnesium can be used, and as the metal, aluminum or the like can be used.

Figure 6:
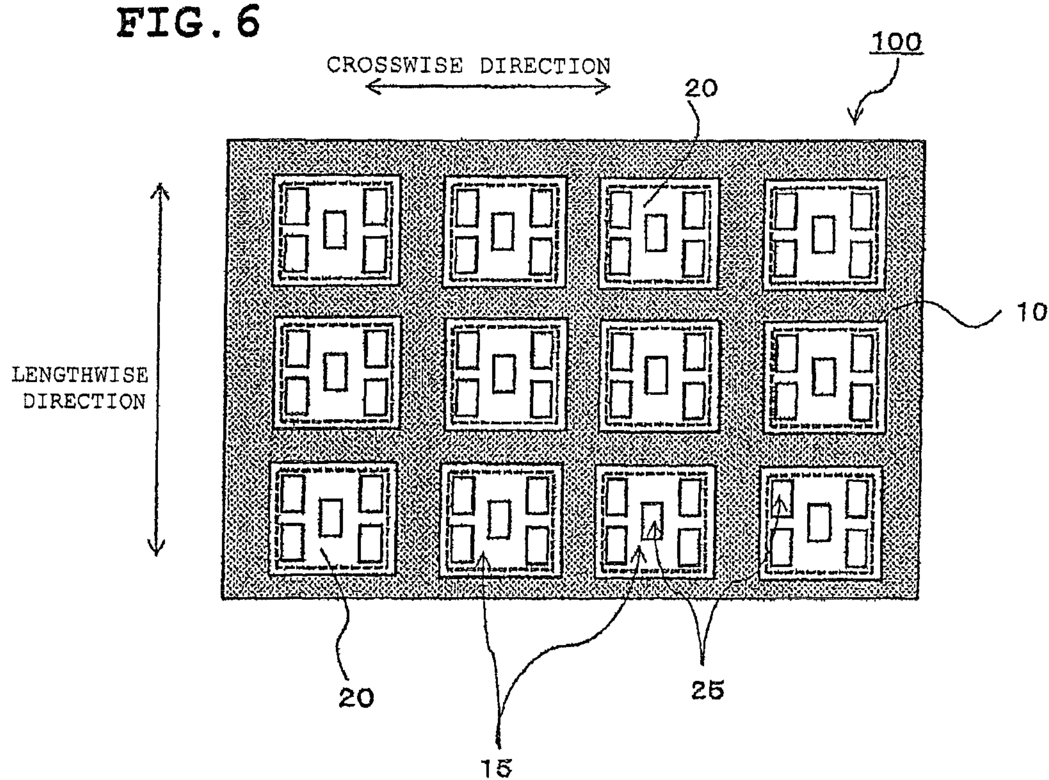
FIG. 6 is an elevation view of a vapor deposition mask of an embodiment as seen from the metal mask side.

Notably, while in the mode described above, the openings 25 are regularly arranged in the lengthwise direction and the crosswise direction, they are not limited to this mode. For example, as shown in FIG. 6, a mode in which the openings 25 are alternately arranged can also be employed. By alternately arranging the openings 25, even in the case where the resin mask 20 undergoes thermal expansion, the openings 25 can absorb expansions arising in portions, and large deformation can be prevented from arising due to accumulation of the expansions.

Metal Mask

Figure 2:
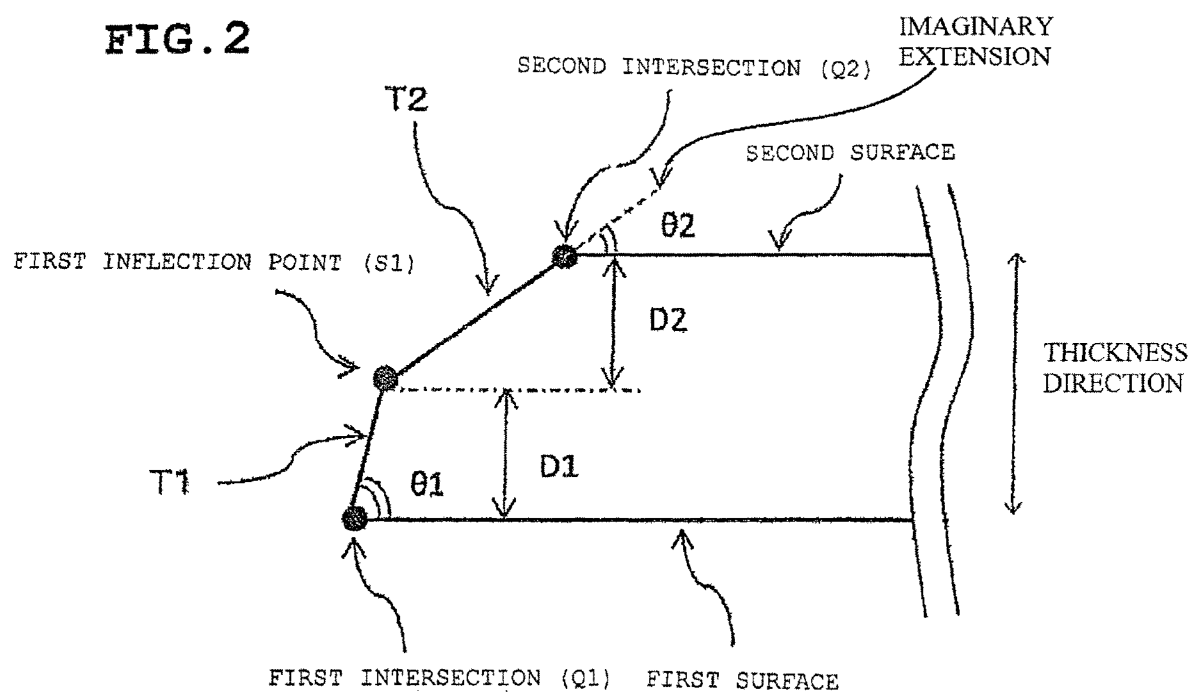
FIG. 2 is a schematic cross-sectional view of A-A portion of the vapor deposition mask shown in FIG. 1 and a diagram for depicting a cross-sectional shape of an inner wall surface of an opening in the thickness direction of the resin mask.
Figure 7:
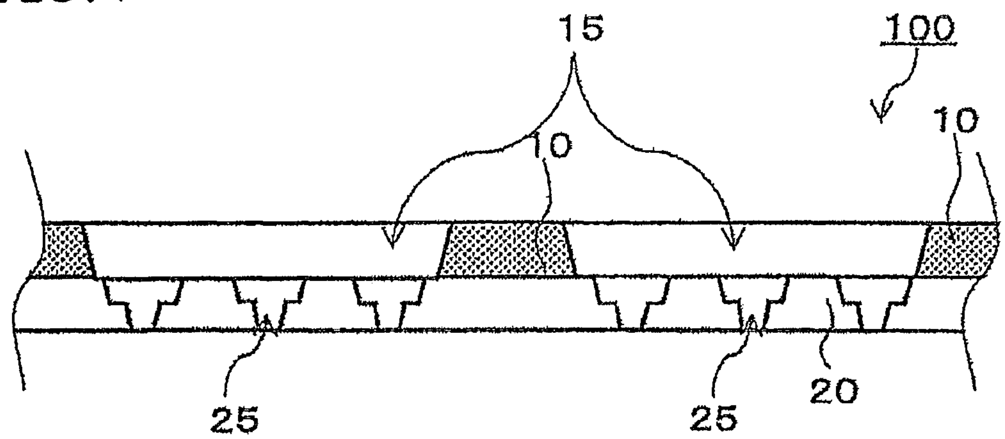
FIG. 7 is an example of a cross section of the vapor deposition mask taken along the B-B line shown in FIG. 1.

As shown in FIG. 7, the metal mask 10 is stacked on one side (the second surface) of the resin mask 20. The metal mask 10 is composed of metal, in which the slits 15 extending in the lengthwise direction or the crosswise direction are arranged. The slit 15 is synonymous with an opening. An arrangement example of the slits is not specially limited. As shown in FIG. 2, the slits extending in the lengthwise direction and the crosswise direction may be arranged in a plurality of rows in the lengthwise direction and the crosswise direction. The slits extending in the lengthwise direction may be arranged in a plurality of rows in the crosswise direction. The slits extending in the crosswise direction may be arranged in a plurality of rows in the lengthwise direction. Moreover, they may be arranged in only one row in the lengthwise direction or the crosswise direction. Notably, FIG. 7 is a cross section of the vapor deposition mask taken along the B-B line shown in FIG. 1, and each of the thickness direction cross sections of the inner wall surfaces opposing in the crosswise direction exhibits the shape exemplarily shown, for example, in FIGS. 2 to 5.

The material of the metal mask 10 is not specially limited but a conventionally known material in the field of the vapor deposition mask can be properly selected and used, and, for example, a metal material such as stainless steel, an iron-nickel alloy, and an aluminum alloy can be cited. Above all, an invar material that is an iron-nickel alloy can be preferably used since an invar material is hardly deformed by heat.

While the thickness of the metal mask 10 is not specially limited, in order to more effectively prevent generation of a shadow, it is preferably about 100 μm or less, still preferably about 50 μm or less, particularly preferably about 35 μm or less. Notably, in the case of being thinner than about 5 μm, risks of rupture and deformation tend to increase and handling tends to become difficult.

Moreover, while in the mode shown in FIG. 1, the opening shape of the slit 15 exhibits a rectangular shape, the opening shape is not specially limited and the opening shape of the slit 15 may be any shape such as a trapezoid and a circle.

While the cross-sectional shape of the slit 15 formed in the metal mask 10 is not specially limited, it is preferably a shape that extends outwardly toward the vapor deposition source as illustrated in FIG. 7. In other words, it is preferably a shape that extends outwardly from the surface on the side in contact with the resin mask 20 toward the surface on the side not in contact with the resin mask 20. More specifically, an angle formed by the inner wall surface of the slit 15 and the surface of the metal mask 10 on the side in contact with the resin mask 20 (the lower surface of the metal mask in the shown mode) in the thickness direction cross section of the inner wall surface composing the slit 15 of the metal mask 10 is preferably within a range of about 5° to 85°, still preferably within a range of about 15° to 80°, further preferably within a range of about 25° to 65°. In particular, within this range, it is preferably an angle smaller than a vapor deposition angle of a vapor deposition machine to be used.

A method of stacking the metal mask 10 on the resin mask is not specially limited but the metal mask 10 may be pasted on the resin mask 20 using various adhesives or by using a resin mask that has self-adhesion. The dimensions of the resin mask 20 and the metal mask 10 may be the same or may be different. Notably, with fixing to a frame which is arbitrarily performed afterward taken into consideration, the dimension of the resin mask 20 is preferably made smaller than that of the metal mask 10 to set the outer circumferential portion of the metal mask 10 to be in the state of exposure, which facilitates fixing of the metal mask 10 to the frame.

Hereafter, modes of the vapor deposition mask which enables a vapor deposition pattern with higher definition to be produced are described, exemplified by a first embodiment and a second embodiment. Notably, the vapor deposition mask 100 of an embodiment of the present invention is not limited to the modes described below but may be in any mode as long as the metal mask 10 in which the slit 15 is formed and the resin mask 20 in which the opening 25 corresponding to a pattern to be produced by vapor deposition is formed are stacked on each other, and the cross-sectional shape of the inner wall surface for composing the opening 25 satisfies the conditions described above. For example, the slits 15 formed in the metal mask 10 may be a stripe shape (not-shown). Moreover, the slit 15 of the metal mask 10 may be provided at a position not overlapping the entirety of one screen. The one screen is mentioned later.

Vapor Deposition Mask of First Embodiment

Figure 8:
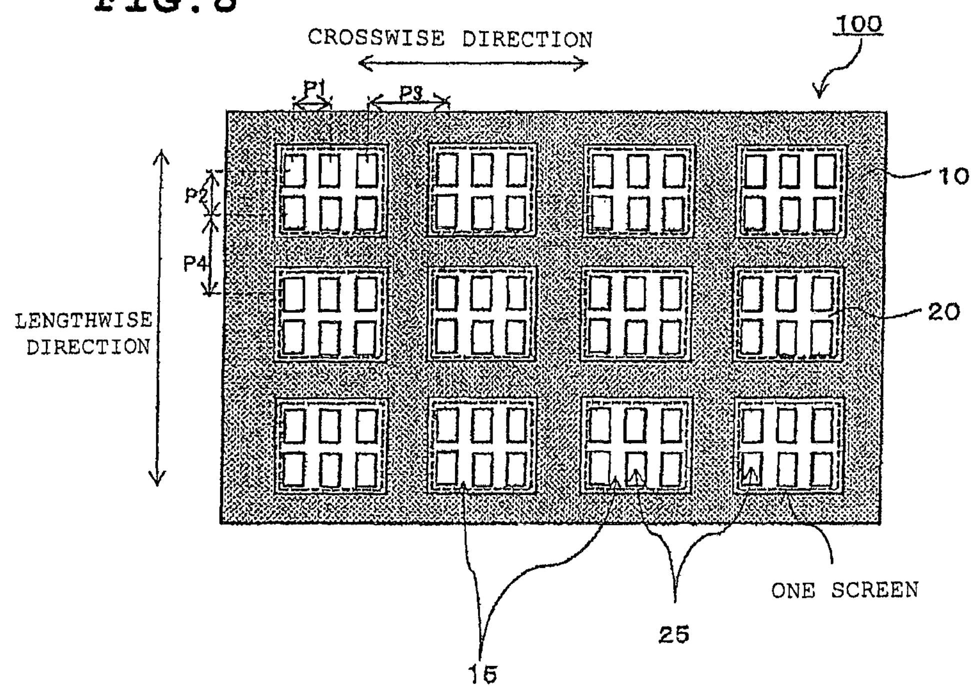
FIG. 8 is an elevation view of a vapor deposition mask of a first embodiment as seen from the metal mask side.
Figure 9:
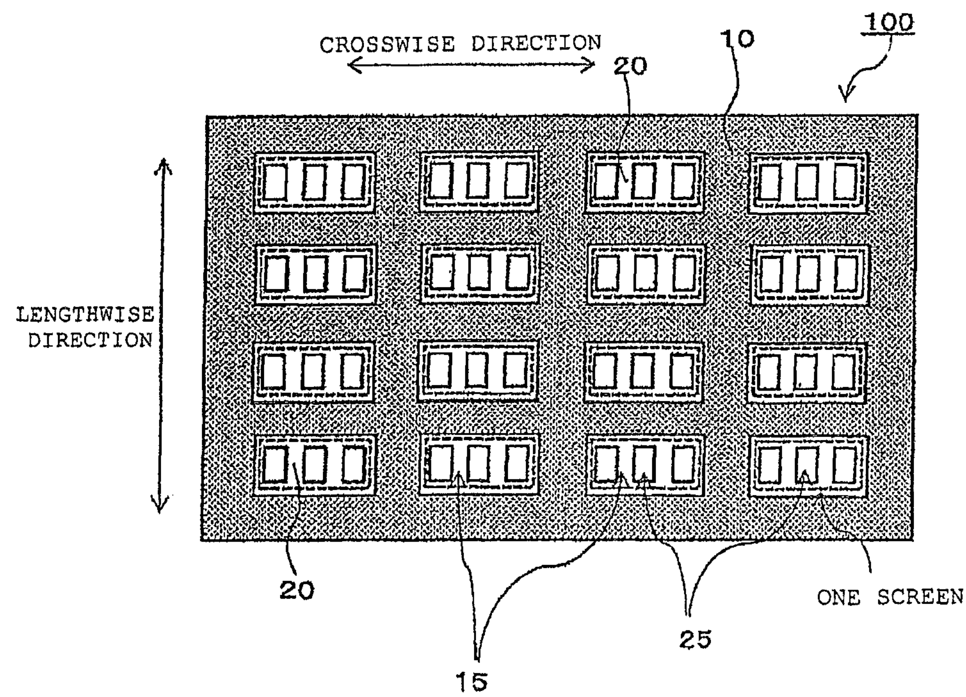
FIG. 9 is an elevation view of the vapor deposition mask of the first embodiment as seen from the metal mask side.
Figure 10:
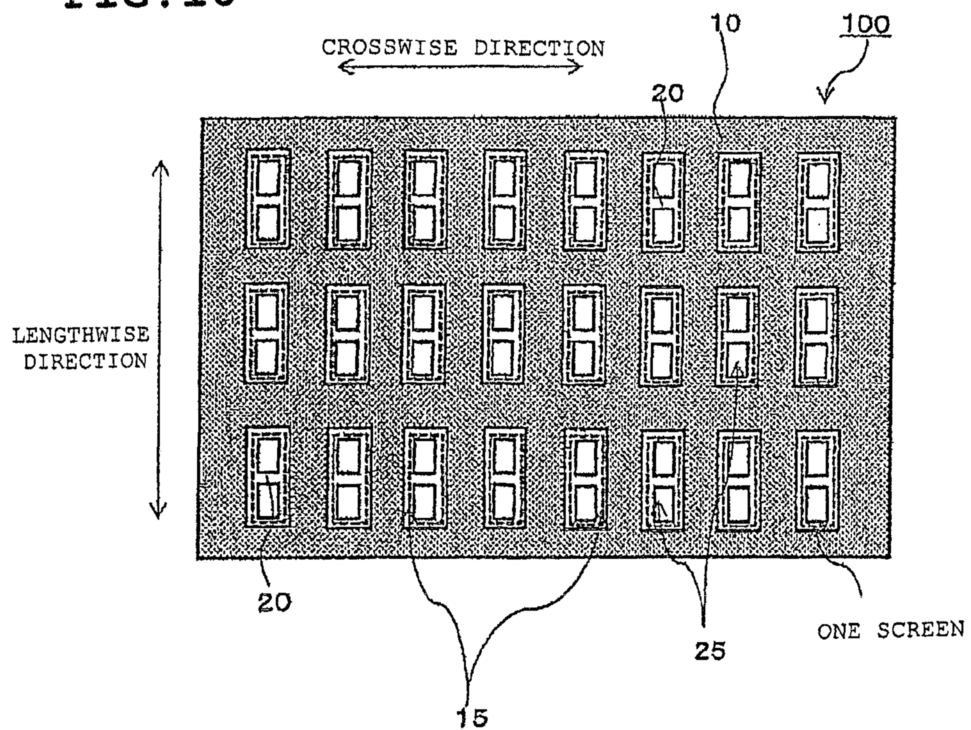
FIG. 10 is an elevation view of the vapor deposition mask of the first embodiment as seen from the metal mask side.

As shown in FIG. 8, the vapor deposition mask 100 of the first embodiment of the present invention is a vapor deposition mask for simultaneously forming vapor deposition patterns for a plurality of screens, and is characterized in that the metal mask 10 in which the plurality of slits 15 are provided is stacked on one surface of the resin mask 20, the openings 25 required for composing the plurality of screens are provided in the resin mask 20, and each slit 15 is provided at a position overlapping the entirety of at least one screen. Furthermore, the vapor deposition mask 100 of the first embodiment is characterized in that the inner wall surface for composing the opening 25 of the resin mask 20 has at least one inflection point (S1) in the thickness direction cross section. An intersection of the first surface of the resin mask 20 and the inner wall surface is the first intersection (Q1), the intersection of the second surface of the resin mask 20 and the inner wall surface is the second intersection (Q2), and the inflection point (S1) is positioned between the first intersection (Q1) and the second intersection (Q2). An angle (θ1), formed between the straight line (T1) connecting the first intersection (Q1) and the inflection point (S1) and the first surface, is larger than the angle (θ2), formed between an imaginary extension of the straight line (T2) connecting the inflection point (S1) and the second intersection (Q2) and the second surface. At least a portion of the inner wall surface extends outwardly from the first surface toward the second surface in the thickness direction.

The vapor deposition mask 100 of the first embodiment is a vapor deposition mask used for simultaneously forming vapor deposition patterns for a plurality of screens. One vapor deposition mask 100 can simultaneously form vapor deposition patterns compatible with a plurality of products. "Openings" stated in the vapor deposition mask of the first embodiment mean patterns to be produced with use of the vapor deposition masks 100 of the first embodiment. For example, when the relevant vapor deposition mask is used for forming an organic layer in an organic EL display, the shape of the openings 25 is a shape of the relevant organic layer. Moreover, "one screen" is constituted of an aggregate of openings 25 corresponding to one product. When the relevant one product is an organic EL display, an aggregate of organic layers required for forming one organic EL display, in other words, an aggregate of openings 25 to be the organic layer is "one screen". Further, in the vapor deposition mask 100 of the first embodiment, in order to simultaneously form the vapor deposition patterns for the plurality of screens, the above-mentioned "one screen" is arranged for each of the plurality of screens in the resin mask 20 at predetermined intervals. Namely, in the resin mask 20, the openings 25 required for composing the plurality of screens are provided.

The vapor deposition mask of the first embodiment includes the metal mask 10 in which the plurality of slits 15 are provided on one surface of the resin mask, wherein each of the slits is provided at the position overlapping the entirety of at least one screen. In other words, it is characterized in that between the openings 25 required for composing one screen, metal line portions which have the same length as the length of the slit 15 in the lengthwise direction and have the same thickness as that of the metal mask 10 between the openings 25 adjacent in the crosswise direction, or metal line portions which have the same length as the length of the slit 15 in the crosswise direction and have the same thickness as that of the metal mask 10 between the openings 25 adjacent in the lengthwise direction do not exist. Hereafter, the metal line portions which have the same length as the length of the slit 15 in the lengthwise direction and have the same thickness as that of the metal mask 10 and the metal line portions which have the same length as the length of the slit 15 in the crosswise direction and have the same thickness as that of the metal mask 10 are sometimes collectively referred to simply as metal line portions.

According to the vapor deposition mask 100 of the first embodiment, even when the dimension of the openings 25 required for composing one screen and the pitch between the openings 25 composing one screen are made small, for example, even when the dimension of the openings 25 and the pitch between the openings 25 are made extremely fine in order to form a screen exceeding about 400 ppi, interference due to metal line portions can be prevented and an image with high definition can be formed. Notably, when one screen is divided by a plurality of slits, in other words, when the metal line portions which have the same thickness as that of the metal mask 10 exist between the openings 25 composing one screen, as the pitch between the openings 25 composing one screen is smaller, the metal line portions existing between the openings 25 become a hindrance in formation of the vapor deposition pattern on the vapor deposition target, which causes formation of a vapor deposition pattern with high definition to be difficult. In other words, when the metal line portions which have the same thickness as that of the metal mask 10 exist between the openings 25 composing one screen, the metal line portions result in generation of a shadow, which causes formation of a screen with high definition to be difficult.

Next, referring to FIGS. 8 to 11B, the openings 25 composing one screen are exemplarily described. Notably, the region obtained by closing with a broken line in the shown modes is one screen. In the shown modes, while an aggregate of a small number of openings 25 is one screen for convenience of description, not limited to these modes, for example, the openings 25 for millions of pixels may present in one screen, where one opening 25 is one pixel.

In the mode shown in FIG. 8, one screen is composed of an aggregate of openings 25 having a plurality of openings 25 provided in the lengthwise direction and the crosswise direction. In the mode shown in FIG. 9, one screen is composed of an aggregate of openings 25 having a plurality of openings 25 provided in the crosswise direction. Moreover, in the mode shown in FIG. 10, one screen is composed of an aggregate of openings 25 having a plurality of openings 25 in the lengthwise direction. Further, in FIGS. 8 to 10, the slit 15 is provided at a position overlapping the entirety of one screen.

Figure 11A:
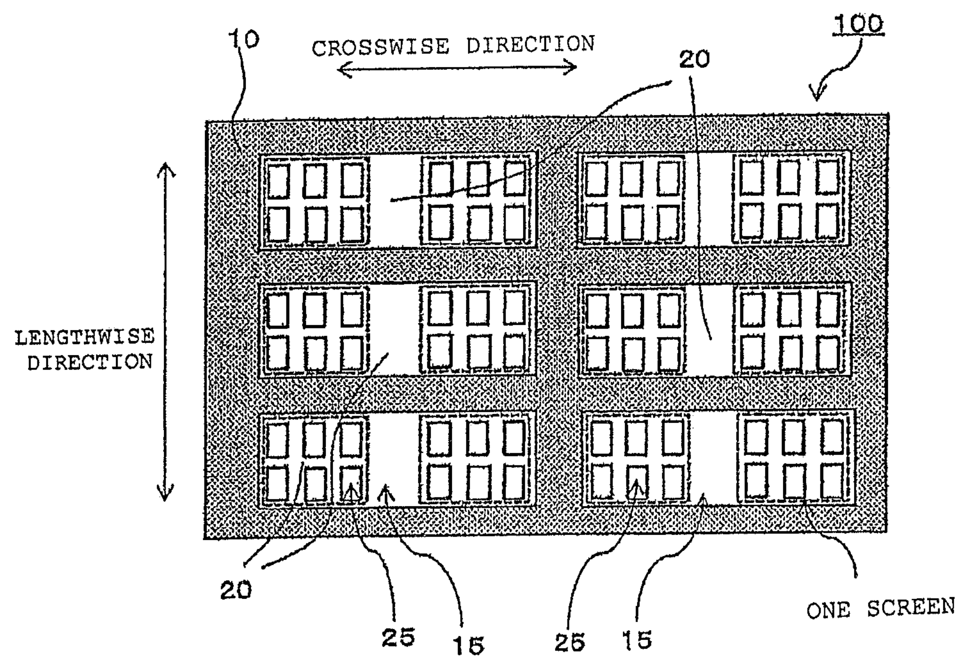
FIGS. 11A and 11B are elevation views of a vapor deposition mask of the first embodiment as seen from the metal mask side.
Figure 11B:
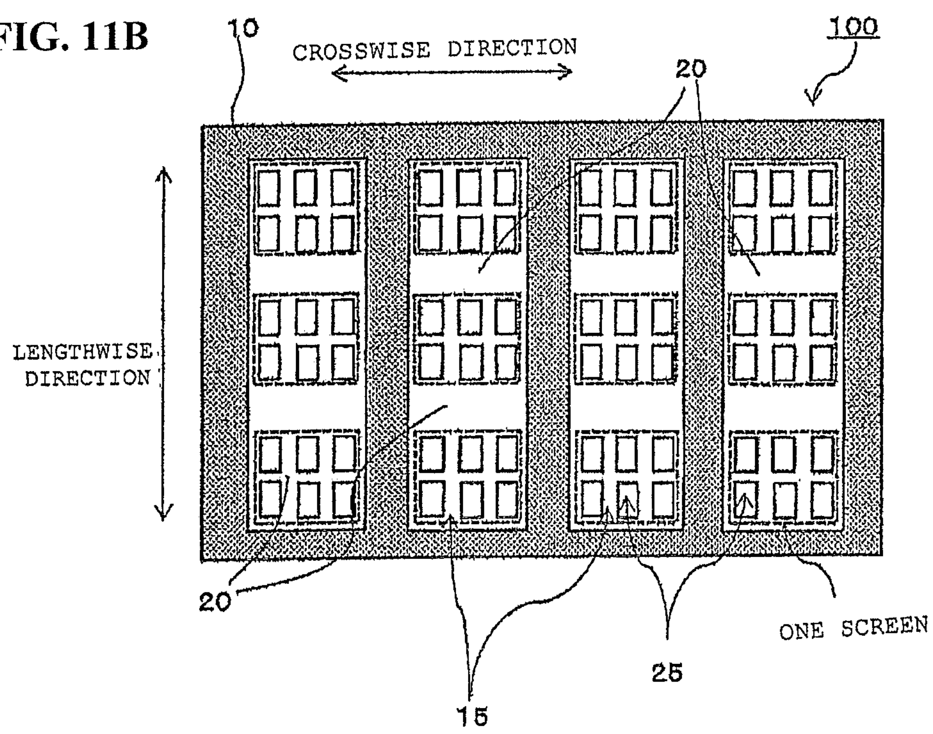

As described above, the slit 15 may be provided at a position overlapping only one screen, or as shown in FIGS. 11A and B, the slit 15 may be provided at a position overlapping the entirety of two or more screens. In FIG. 11A, in the resin mask 10 shown in FIG. 8, the slit 15 is provided at a position overlapping the entirety of two screens continuous in the crosswise direction. In FIG. 11B, the slit 15 is provided at a position overlapping the entirety of three screens continuous in the lengthwise direction.

Next, exemplified by the mode shown in FIG. 8, pitches between the openings 25 composing one screen and pitches between the screens are described. The pitches between the openings 25 composing one screen and the dimension of the opening 25 are not specially limited, but can be properly set depending on the pattern to be produced by vapor deposition. For example, when forming the vapor deposition pattern with high definition of about 400 ppi, a pitch (P1) in the crosswise direction and a pitch (P2) in the lengthwise direction between the neighboring openings 25 out of the openings 25 composing one screen are approximately 60 μm. Moreover, the dimension of the opening is approximately 500 $\mu m^2$ to 1000 $\mu m^2$. Moreover, one opening 25 is not limited to correspond to one pixel, but, for example, a plurality of pixels can be collectively one opening 25 depending on a pixel arrangement.

While a pitch (P3) in the crosswise direction and a pitch (P4) in the lengthwise direction between the screens are not specially limited, as shown in FIG. 8, when one slit 15 is provided at the position overlapping the entirety of one screen, metal line portions are to exist between the screens. Accordingly, when the pitch (P4) in the lengthwise direction and the pitch (P3) in the crosswise direction between the screens are smaller than or substantially equal to the pitch (P2) in the lengthwise direction and the pitch (P1) in the crosswise direction of the openings 25 provided in one screen, the metal line portions existing between the screens is liable to break. Accordingly, with this point taken into consideration, the pitch (P3, P4) between the screens is preferably wider than the pitch (P1, P2) between the openings 25 composing one screen. An example of the pitch (P3, P4) between the screens is approximately 1 mm to 100 mm. Notably, the pitch between the screens means the pitch between the neighboring openings in one screen and another screen adjacent to the relevant one screen. The same holds true for the pitch of the openings 25 and the pitch between the screens in the vapor deposition mask of the second embodiment mentioned later.

Notably, as shown in FIGS. 11A and 11B, in the case where one slit 15 is provided at a position overlapping the entirety of two or more screens, the metal line portions composing the inner wall surfaces of the slits do not exist between the plurality of screens provided in the one slit 15. Accordingly, in this case, the pitch between the two or more screens provided at the position overlapping the one slit 15 may be substantially equal to the pitch between the openings 25 composing one screen.

Further, on the resin mask 20, grooves may be formed to extend in the lengthwise direction or the crosswise direction of the resin mask 20. While in the case of application of heat in vapor deposition, there is a possibility that the resin mask 20 undergoes thermal expansion, and thereby, changes in dimension and position of the opening 25 arise. By forming the grooves, they can absorb the expansion of the resin mask, and can prevent the changes in dimension and position of the opening 25 caused by the resin mask 20 expanding in a predetermined direction as a whole due to accumulation of thermal expansions arising in portions in the resin mask. Formation positions of the grooves are not limited, but while they may be provided between the openings 25 composing one screen and at positions overlapping the openings 25, they may be preferably provided between the lengthwise screens. Moreover, the grooves may be provided on one surface of the resin mask, for example, only on the surface on the side that is in contact with the metal mask, or may be provided only on the surface on the side that is not in contact with the metal mask. Otherwise, they may be provided on both surfaces of the resin mask 20.

Further, the grooves extending in the lengthwise direction may be formed between the neighboring screens and the grooves extending in the crosswise direction may be formed between the neighboring screens. Furthermore, the grooves can be formed in an aspect having these combined.

While the depth and the width of the grooves are not specially limited, since the rigidity of the resin mask 20 tends to decrease in the case where the depth of the grooves is too large and in the case where the width thereof is too large, the setting is needed with this point taken into consideration. Moreover, the sectional shape of the grooves is not specially limited, but only has to be arbitrarily selected as a U-shape, a V-shape or the like with the processing method or the like taken into consideration. The same holds true for the vapor deposition mask of the second embodiment.

Vapor Deposition Mask of Second Embodiment

Figure 12:
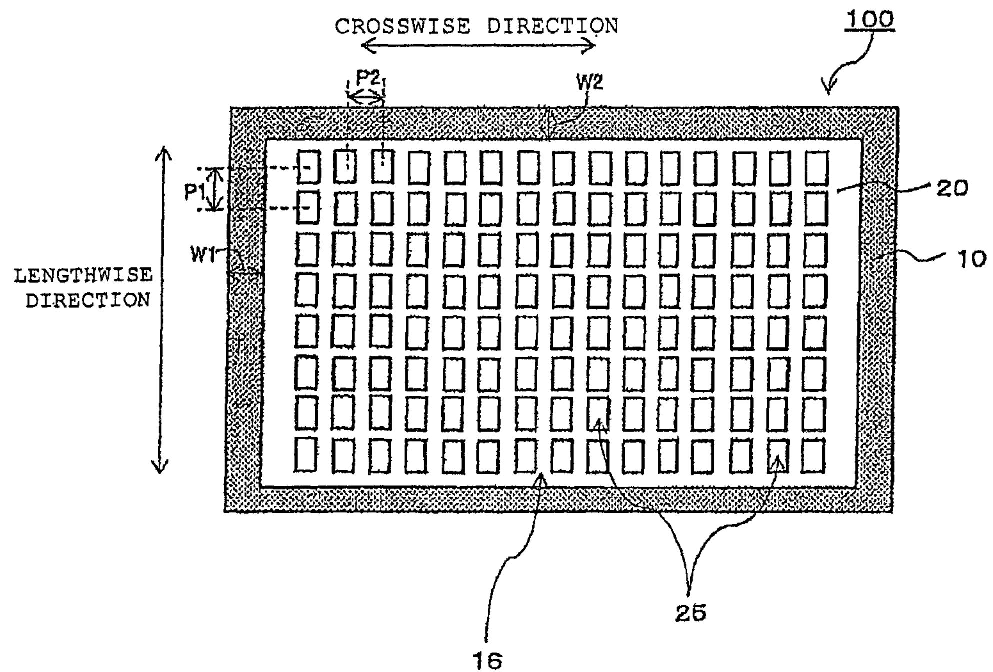
FIG. 12 is an elevation view of a vapor deposition mask of a second embodiment as seen from the metal mask side.

Next, the vapor deposition mask of the second embodiment is described. As shown in FIG. 12, the vapor deposition mask of the second embodiment is characterized in that the metal mask 10 in which one slit (one through hole 16) is provided is stacked on one surface of the resin mask 20 in which the plurality of openings 25 corresponding to a pattern to be produced by vapor deposition are provided, and all of the plurality of openings 25 are provided at a position overlapping one through hole provided in the metal mask 10. Furthermore, the vapor deposition mask of the second embodiment is also characterized in that the inner wall surface for composing the opening 25 of the resin mask 20 has at least one inflection point (S1) in the thickness direction cross section. An intersection of the first surface and the inner wall surface is the first intersection (Q1), the intersection of the second surface and the inner wall surface is the second intersection (Q2), and the inflection point (S1) is positioned between the first intersection (Q1) and the second intersection (Q2). An angle (θ1), formed between the straight line (T1) connecting the first intersection (Q1) and the inflection point (S1) and the first surface, is larger than the angle (θ2), formed between an imaginary extension of the straight line (T2) connecting the inflection point (S1) and the second intersection (Q2) and the second surface. At least a portion of the inner wall surface extends outwardly from the first surface toward the second surface in the thickness direction.

The opening 25 stated in the second embodiment means an opening required for forming the vapor deposition pattern on the vapor deposition target. An opening not required for forming the vapor deposition pattern on the vapor deposition target may be provided at a position not overlapping the one through hole 16. Notably, FIG. 12 is an elevation view which exemplarily shows the vapor deposition mask of the second embodiment and is of the vapor deposition mask as seen from the metal mask side.

In the vapor deposition mask 100 of the second embodiment, the metal mask 10 having the one through hole 16 is provided on the resin mask 20 having the plurality of openings 25, and all of the plurality of openings 25 are provided at a position overlapping the one through hole 16. In the vapor deposition mask 100 of the second embodiment that has this configuration, metal line portions that have the same thickness as the thickness of the metal mask or a larger thickness than the thickness of the metal mask do not exist between the openings 25. Hence, as described for the aforementioned vapor deposition mask of the first embodiment, the vapor deposition pattern with high definition can be formed to match the dimensions of the openings 25 provided in the resin mask 20 without interference of metal line portions suffered.

Furthermore, according to the vapor deposition mask of the second embodiment, since there is almost no influence of a shadow even when the thickness of the metal mask 10 is made large, the thickness of the metal mask 10 can be made large until durability and handling ability can be sufficiently satisfied, which enables the formation of the vapor deposition pattern with high definition and can improve durability and handling ability.

Resin Mask

The resin mask 20 in the vapor deposition mask of the second embodiment is composed of a resin, and as shown in FIG. 12, the plurality of openings 25 corresponding to the pattern to be produced by vapor deposition are provided at the position overlapping one through hole 16. The openings 25 correspond to the pattern to be produced by vapor deposition, and the vapor deposition pattern corresponding to the openings 25 is formed on the vapor deposition target by allowing the vapor deposition material released from the vapor deposition source to pass through the openings 25. Notably, in the shown mode, while the openings arranged in a plurality rows in the lengthwise direction and the crosswise direction are exemplarily described, they may be arranged only in the lengthwise direction or the crosswise direction.

The vapor deposition mask 100 of the second embodiment may be used for formation of the vapor deposition pattern corresponding to one screen, or may be used for simultaneous formation of the vapor deposition patterns corresponding to two or more screens. "One screen" in the vapor deposition mask of the second embodiment means an aggregate of openings 25 corresponding to one product. When the one product is an organic EL display, an aggregate of organic layers required for forming one organic EL display, in other words, an aggregate of openings 25 to be the organic layers is "one screen". While the vapor deposition mask of the second embodiment may be constituted of only "one screen" or may be provided by arranging the "one screen" for each of a plurality of screens, in the case where the "one screen" is arranged for each of the plurality of screens, the openings 25 are preferably provided at predetermined intervals on a screen-by-screen basis (refer to FIG. 11 for the first embodiment). The mode of "one screen" is not specially limited but, for example, the one screen can also be composed of millions of openings 25, where one opening 25 is one pixel.

Metal Mask

The metal mask 10 in the vapor deposition mask 100 of the second embodiment is composed of metal and has the one through hole 16. Further, in an embodiment of the present invention, the relevant one through hole 16 is disposed at the position overlapping all of the openings 25, in other words, at the position where all of the openings 25 arranged in the resin mask 20 can be seen, as seen head-on of the metal mask 10.

Figure 13:
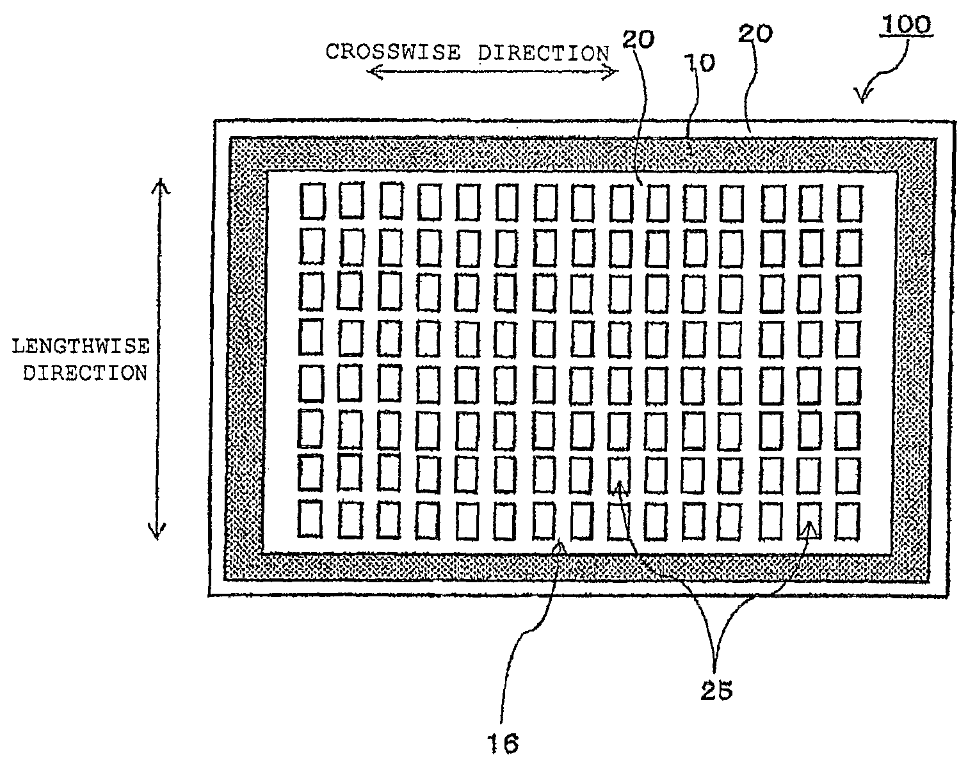
FIG. 13 is an elevation view of the vapor deposition mask of the second embodiment as seen from the metal mask side.

The metal portion composing the metal mask 10, that is, the portion thereof other than the one through hole 16 may be provided along the outer edge of the vapor deposition mask 100 as shown in FIG. 12, or the dimension of the metal mask 10 may be made smaller than that of the resin mask 20 to expose an outer circumferential portion of the resin mask 20 as shown in FIG. 13. Moreover, the dimension of the metal mask 10 may be made larger than that of the resin mask 20, so that a part of the metal portion is caused to protrude outward in the crosswise direction of the resin mask or outward in the lengthwise direction thereof. Notably, in any case, the dimension of the one through hole 16 is configured to be smaller than the dimension of the resin mask 20.

While a width (W1) in the crosswise direction and a width (W2) in the lengthwise direction of the metal portion constituting the wall surface of the one through hole of the metal mask 10 shown in FIG. 12 are not specially limited, as the width W1, W2 is made smaller, durability and handling ability tend to deteriorate more. Accordingly, W1 and W2 are preferably widths by which durability and handling ability are sufficiently satisfied. While appropriate widths can be properly set depending on the thickness of the metal mask 10, as an example of preferable widths, both W1 and W2 are approximately 1 mm to 100 mm as the metal mask of the first embodiment.

Method for Producing Vapor Deposition Mask

Next, a method for producing the vapor deposition mask of an embodiment of the present invention is exemplarily described.

Figure 14A:
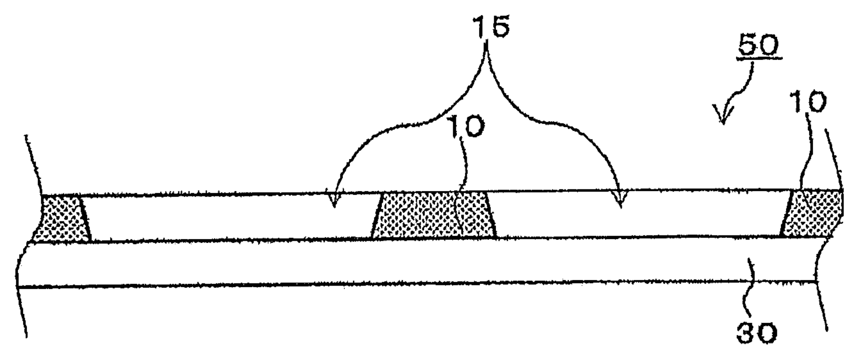
FIGS. 14A to 14C are diagrams for explaining a method for producing a vapor deposition mask of an embodiment and ACare cross-sectional views.
Figure 14B:
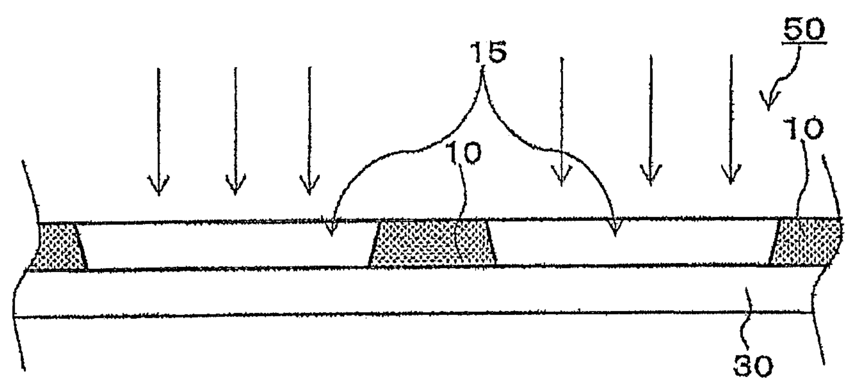
Figure 14C:
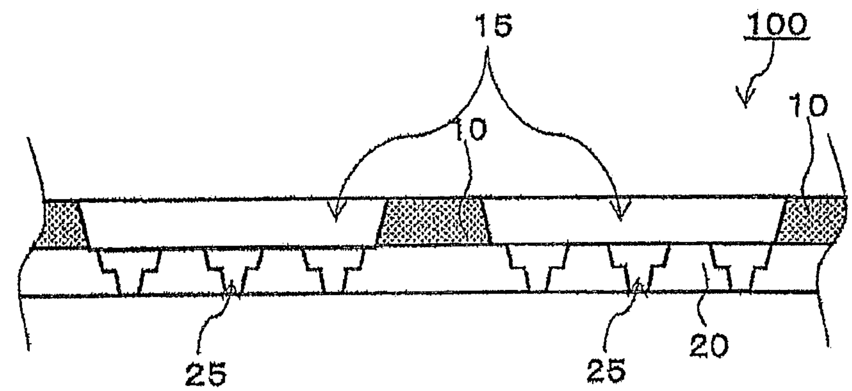

The vapor deposition mask of an embodiment of the present invention can be obtained by preparing a resin plate-equipped metal mask 50 in which the metal mask 10 provided with the slits 15 is stacked on one surface of a resin plate 30 as shown in FIG. 14A, and next, by irradiating the resin plate-equipped metal mask 50 with a laser through the slits 15 from the metal mask 10 side as shown in FIG. 14B to form the openings 25 corresponding to the pattern to be produced by vapor deposition in the resin plate 30 as shown in FIG. 14C.

As a method of forming the resin plate-equipped metal mask 50, the metal mask 10 provided with the slits 15 is stacked on one surface of the resin plate 30. The resin plate 30 can employ the materials described for the aforementioned resin mask 20.

As the forming method of the metal mask 10 in which the slits 15 are provided, a masking member, for example, a resist material is applied onto the surface of the metal plate, predetermined portions are exposed and developed, and thereby, a resist pattern in which positions where the slits 15 are finally formed remain is formed. The resist material used as the masking member is preferably excellent in processing ability with desired resolution. Next, etching processing is performed by the etching method with use of the resist pattern as an etching resistant mask. After the completion of the etching, the resist pattern is cleaned and removed. By doing so, the metal mask 10 in which the slits 15 are provided is obtained. The etching for forming the slits 15 may be performed on one surface side of the metal plate, or may be performed on both surface sides thereof. Moreover, in the case where the slits 15 are formed in the metal plate with use of the stacked body in which the resin plate is provided on the metal plate, the masking member is applied onto the surface of the metal plate on the side that is not in contact with the resin plate, and the slits 15 are formed by the etching from one surface side. Notably, in the case where the resin plate has etching resistance with respect to the etching agent of the metal plate, masking of the surface of the resin plate is not needed, but in the case where the resin plate does not have resistance with respect to the etching agent of the metal plate, the masking member is needed to be applied onto the surface of the resin plate. Moreover, in the above, while the resist material is mainly described as the masking member, in place of the application of the resist material, a dry film resist may be laminated to perform the similar patterning.

In the aforementioned method, the resin plate 30 composing the resin plate-equipped metal mask 50 may be a resin layer or a resin film formed by coating as well as a plate-shaped resin. In other words, the resin plate may be prepared beforehand. In the case of forming the resin plate-equipped metal mask 50 using the metal plate and the resin plate 30, the resin layer or the resin film to be the resin mask in the final stage can also be formed on the metal plate by a conventionally known coating method or the like.

As a method of forming the openings 25, the resin plate is penetrated using a laser processing method, fine press processing, photolithography processing or the like on the resin plate-equipped metal mask 50 prepared above to form the openings 25 corresponding to the pattern to be produced by vapor deposition in the resin plate. Thereby, the vapor deposition mask 100 of an embodiment of the present invention is obtained in which the metal mask 10 provided with the slits 15 is stacked on one surface of the resin mask 20 in which the openings 25 corresponding to the pattern to be produced by vapor deposition are provided. Notably, in view of capability of easily forming the openings 25 with high definition, the laser processing method is preferably used for the formation of the openings 25. A method of forming the thickness direction cross-sectional shape of the inner wall surface of the opening described above is not specially limited but the formation can also be properly performed using multistage laser processing or a photolithography processing method. For example, in the photolithography processing method, by properly configuring an etching agent, an etching rate, an etching time and the like in multistage etching processing, side etching can also be caused to arise in the thickness direction cross section of the opening to set ($\theta 1$) and ($\theta 2$) mentioned above in the thickness direction cross section of the opening within predetermined angle ranges. Moreover, simultaneously using both the laser processing and the photolithography processing, the openings can also be formed in which the thicknesswise cross-sectional shape of the inner wall surface is the shape described above.

Moreover, the aforementioned formation of the openings 25 is preferably performed after the resin plate-equipped metal mask 50 is fixed to the frame. According to this method of forming the openings 25, since the openings 25 with the aforementioned feature are provided afterward with respect to the resin plate-equipped metal mask which is in the state of being fixed to the frame, the precision in positional coordinate of the openings 25 can be exceedingly improved. Notably, in the case of fixing the completed vapor deposition mask 100 to the frame, the precision in positional coordinate of the openings 25 deteriorates since the metal mask in which the opening is defined is fixed to the frame under expanding. The frame is mentioned later.

Method for Producing Organic Semiconductor Element

Next, a method for producing an organic semiconductor element of an embodiment of the present invention is described. The method for producing an organic semiconductor element of an embodiment of the present invention has a step of forming a vapor deposition pattern in a vapor deposition method with use of the frame-equipped vapor deposition mask described above. There is not any limitation to the deposition method with use of a frame-equipped vapor deposition mask but, for example, a PVD method (Physical Vapor Deposition) such as a reactive sputtering method, a vacuum vapor deposition method, ion plating and an electron beam vapor deposition method, a CVD method (Chemical Vapor Deposition) such as thermal CVD, plasma CVD and an optical CVD method, and the like can be cited.

The method for producing an organic semiconductor element of an embodiment having the step of forming the vapor deposition pattern in the vapor deposition method with use of the frame-equipped vapor deposition mask has an electrode forming step of forming an electrode on a substrate, an organic layer forming step, a counter electrode forming step, a sealing layer forming step, and the like, and in each of the arbitrary steps, the vapor deposition pattern is formed on the substrate in the vapor deposition method with use of the frame-equipped vapor deposition mask. For example, in the case where the vapor deposition method using the frame-equipped vapor deposition mask is applied to each of light-emitting layer forming steps for colors of R, G and B of an organic EL device, the vapor deposition patterns of light-emitting layers for the respective colors are formed on the substrate. Notably, the Method for producing an organic semiconductor element of an embodiment of the present invention is not limited to these steps, but can be applied to an arbitrary step of a conventionally known organic semiconductor element with use of a vapor deposition method.

In the method for producing an organic semiconductor element of an embodiment of the present invention, in the above-mentioned step of forming the vapor deposition pattern, the vapor deposition mask fixed to the frame is the vapor deposition mask of an embodiment of the present invention described above.

For the vapor deposition mask composing the frame-equipped vapor deposition mask, the vapor deposition mask 100 of an embodiment of the present invention described above can be used as it is, and its detailed description is omitted. According to the vapor deposition mask of an embodiment of the present invention described above, an organic semiconductor element having a pattern with high definition can be formed. As the organic semiconductor element produced in the method for producing of an embodiment of the present invention, for example, organic layers, light-emitting layers, cathode electrodes and the like of an organic EL element can be cited. In particular, the method for producing an organic semiconductor element of an embodiment of the present invention can be preferably used for producing light-emitting layers of R, G and B of an organic EL element for which high definition pattern precision is required.

Figure 15:
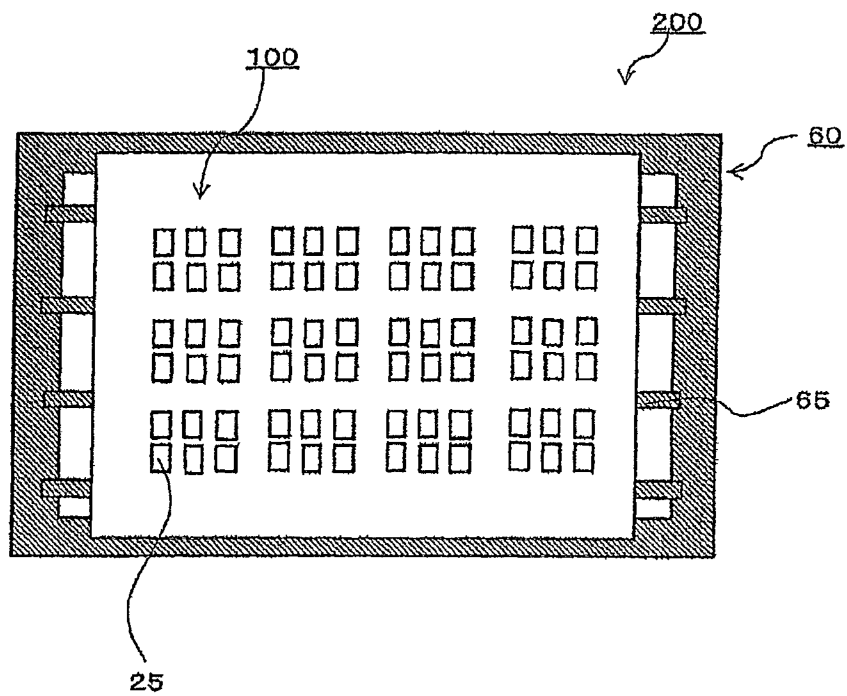
FIG. 15 is an elevation view of a frame-equipped vapor deposition mask of an embodiment as seen from the resin mask side.
Figure 16:
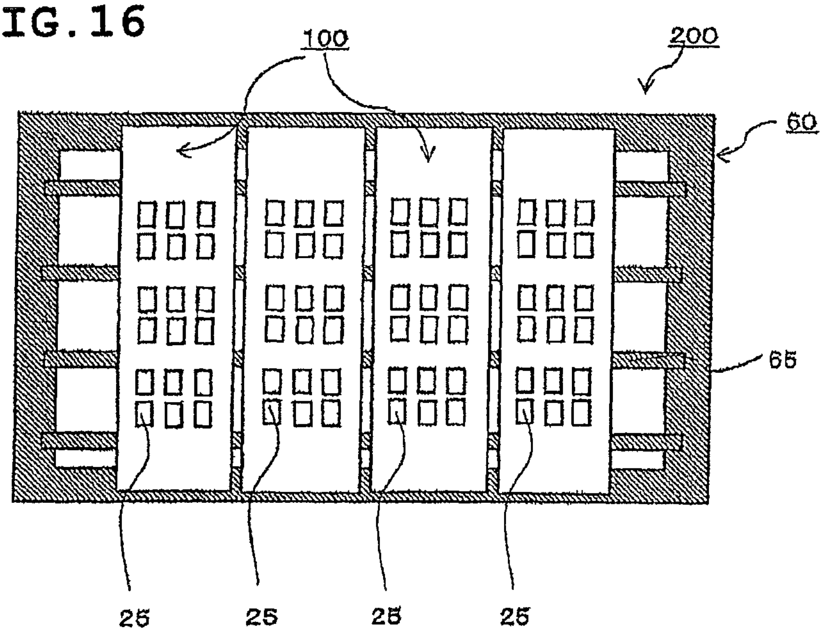
FIG. 16 is an elevation view of a frame-equipped vapor deposition mask of an embodiment as seen from the resin mask side.

The frame-equipped vapor deposition mask used for producing the organic semiconductor element only has to satisfy the condition that the vapor deposition mask of an embodiment of the present invention described above is fixed to the frame, and is not specially limited in other conditions. For example, as shown in FIG. 15, a frame-equipped vapor deposition mask 200 in which one vapor deposition mask 100 is fixed to a frame 60 may be used, or as shown in FIG. 16, a frame-equipped vapor deposition mask 200 in which a plurality of vapor deposition masks (four vapor deposition masks in the shown mode) are fixed to a frame 60 to line up in the lengthwise direction or the crosswise direction (fixed to line up in the crosswise direction in the shown mode) may be used.

The frame 60 is a frame member in a substantially rectangular shape, and has an opening for exposing the openings 25 provided in the resin mask 20 of the vapor deposition mask 100 which is finally fixed, to the vapor deposition source side. The material of the frame is not specially limited but may be a member that can support the vapor deposition mask and, for example, a metal frame, a ceramic frame or the like can be used. Above all, the metal frame is preferable since it is easily welded to the metal mask of the vapor deposition mask and influence such as deformation is small. As the material of the metal frame, a metal material that has large rigidity is preferable such, for example, as SUS and an invar material.

The thickness of the frame is not specially limited, but is preferably approximately 10 mm to 30 mm in view of rigidity and the like. The width between the inner circumferential end face of the opening of the frame and the outer circumferential end face of the frame is not specially limited as long as it is a width with which the relevant frame can be fixed to the metal mask of the vapor deposition mask, but, for example, can be exemplarily a width of approximately 10 mm to 70 mm.

Moreover, a reinforcement frame 65 or the like may exist in the opening of the frame within a range where the exposure of the openings 25 of the resin mask 20 composing the vapor deposition mask 100 is not prevented. In other words, the opening included in the frame 60 may have a configuration in which it is divided by a reinforcement frame or the like. In the mode shown in FIGS. 15 and 16, while a plurality of reinforcement frames 65 extending in the crosswise direction are arranged in the lengthwise direction, in place of these reinforcement frames 65 or along with these, a plurality of rows of reinforcement frames extending in the lengthwise direction may be arranged in the crosswise direction. By using the frame 60 in which the reinforcement frames 65 are arranged, when the plurality of vapor deposition masks 100 of various embodiments described above are fixed to the relevant frame 60 to line up in the lengthwise direction and the crosswise direction, the vapor deposition masks can be fixed to the metal frame 60 even when the vapor deposition masks are placed at positions of overlapping with the reinforcement frames.

A method of fixing the frame 60 to the vapor deposition mask 100 of an embodiment of the present invention is not specially limited, but the fixing can be performed by using spot welding due to laser light, an adhesive, screw fixing or the like.

Frame-Equipped Vapor Deposition Mask

Next, a frame-equipped vapor deposition mask of an embodiment of the present invention is described. As shown in FIGS. 15 and 16, a frame-equipped vapor deposition mask 200 of an embodiment of the present invention is characterized in that the vapor deposition mask 100 is fixed to a frame 60, and the vapor deposition mask 100 fixed to the frame is the above-described vapor deposition mask 100. In other words, as the vapor deposition mask fixed to the frame 60, the metal mask 10 in which the slit 15 overlapping the openings 25 is stacked on one surface of the resin mask 20 in which the openings 25 corresponding to the pattern to be produced by vapor deposition are provided, and furthermore, the inner wall surface for composing the opening 25 of the resin mask 20 has at least one inflection point (S1) in the thickness direction cross section. An intersection of the first surface and the inner wall surface is the first intersection (Q1), the intersection of the second surface and the inner wall surface is the second intersection (Q2), and the inflection point (S1) is positioned between the first intersection (Q1) and the second intersection (Q2). An angle (θ1), formed between the straight line (T1) connecting the first intersection (Q1) and the inflection point (S1) and the first surface, is larger than the angle (θ2), formed between an imaginary extension of the straight line (T2) connecting the inflection point (S1) and the second intersection (Q2) and the second surface. At least a portion of the inner wall surface extends outwardly from the first surface toward the second surface in the thickness direction.

As the frame-equipped vapor deposition mask 200, the frame-equipped vapor deposition mask having been described for the aforementioned method for producing an organic semiconductor element can be used as it is, and the detailed description here is omitted.

According to the frame-equipped vapor deposition mask 200 of an embodiment, generation of a shadow can be sufficiently suppressed while securing the strength of the openings, and a vapor deposition pattern with high definition can be produced on a vapor deposition target.

REFERENCE SIGNS LIST

200 Frame-equipped vapor deposition mask
100 Vapor deposition mask
10 Metal mask
15 Slit
16 Through hole
20 Resin mask
25 Opening
30 Resin plate
50 Resin plate-equipped metal mask
60 Frame

The invention claimed is:

1. A method of producing an organic semiconductor element by vapor deposition, comprising the steps of:

arranging a vapor deposition target, a vapor deposition mask and a vapor deposition source in this order; and forming an organic semiconductor element by using the vapor deposition mask, wherein the vapor deposition mask comprises a resin mask having at least one opening hole corresponding to a pattern to be produced by vapor deposition, the resin mask having a first surface on one surface side thereof and a second surface on another side thereof, wherein the at least one opening hole extends only between the first and second surfaces, and a metal mask being stacked on the second surface of the resin mask, wherein:

the resin mask has a thicknesswise cross section in which the first surface of the resin mask intersects with an inner wall surface of the opening hole at a first intersection, the second surface intersects with the inner wall surface at a second intersection, and a straight line connects the first intersection and the in second intersection;

an angle formed between the inner wall surface and the first surface is larger than an angle formed between the straight line and the first surface in the thicknesswise cross section;

the inner wall surface has a shape having broadening from the first surface toward the second surface in the thicknesswise cross section, and wherein the resin mask faces the vapor deposition target during the forming step.

2. The method of producing an organic semiconductor element according to claim 1, wherein the inner wall surface intersects with the straight line at a different part from the first intersection and the second intersection.

3. The method of producing an organic semiconductor element according to claim 1, wherein a shape of the opening hole of the resin mask in a plan view of the vapor deposition mask is a polygonal shape.

4. The method of producing an organic semiconductor element according to claim 1, wherein a shape of the opening hole of the resin mask in a plan view of the vapor deposition mask is a shape having a curvature.

5. The method of producing an organic semiconductor element according to claim 1, wherein the vapor deposition mask is equipped with a frame.

6. A method of producing an organic semiconductor element by vapor deposition, comprising the steps of:

arranging a vapor deposition target, a vapor deposition mask and a vapor deposition source in this order; and forming an organic semiconductor element by using the vapor deposition mask, wherein the vapor deposition mask comprises a resin mask having at least one opening hole corresponding to a pattern to be produced by vapor deposition, the resin mask having a first surface on one surface side thereof and a second surface on another side thereof, wherein the at least one opening hole extends only between the first and second surfaces; and a metal mask being stacked on the second surface of the resin mask, wherein:

the resin mask has a thicknesswise cross section in which the first surface of the resin mask intersects with an inner wall surface of the opening hole at a first intersection, the second surface intersects with the inner wall surface at a second intersection, and a straight line connects the first intersection and the second intersection;

at least one area of the inner wall surface including the first intersection of the inner wall surface is located on a side of the second surface relative to the straight line, in the thicknesswise cross section;

the inner wall surface has a shape having broadening from the first surface toward the second surface in the thicknesswise cross section, and wherein the resin mask faces the vapor deposition target during the forming step.

7. The method of producing an organic semiconductor element according to claim 6, wherein the inner wall surface intersects with the straight line at a different part from the first intersection and the second intersection.

8. The method of producing an organic semiconductor element according to claim 6, wherein a shape of the opening hole of the resin mask in a plan view of the vapor deposition mask is a polygonal shape.

9. The method of producing an organic semiconductor element according to claim 6, wherein a shape of the opening hole of the resin mask in a plan view of the vapor deposition mask is a shape having a curvature.

10. The method of producing an organic semiconductor element according to claim 6, wherein the vapor deposition mask is equipped with a frame.

* * * * *